United States Patent [19]

Nakagawa et al.

[11] Patent Number: 4,803,948
[45] Date of Patent: Feb. 14, 1989

[54] HEAT PROCESSING APPARATUS FOR SEMICONDUCTOR MANUFACTURING

[75] Inventors: Keiji Nakagawa, Kadoma; Ikuyoshi Nakatani, Hazukashi; Takamasa Sakai, Kusatsu; Yusuke Muraoka, Osaka, all of Japan

[73] Assignee: Dainippon Screen Mfg. Co., Ltd., Japan

[21] Appl. No.: 36,803

[22] Filed: Apr. 10, 1987

[30] Foreign Application Priority Data

Apr. 14, 1986 [JP] Japan ............................. 61-54753[U]

[51] Int. Cl.$^4$ ............................................ C23C 16/00
[52] U.S. Cl. ..................................... 118/725; 118/724; 118/50; 118/50.1
[58] Field of Search ................. 118/724, 725, 50, 50.1

[56] References Cited

U.S. PATENT DOCUMENTS

| 4,449,037 | 5/1984 | Shibamata | 118/725 |
| 4,487,161 | 12/1984 | Hirata | 118/725 |
| 4,640,223 | 2/1987 | Dozier | 118/725 |

Primary Examiner—Richard Bueker
Attorney, Agent, or Firm—Ostrolenk, Faber, Gerb & Soffen

[57] ABSTRACT

A heat processing apparatus for manufacturing semiconductors is constructed such that an airtightly sealing part is provided at the tubular end having equal diameter to that of a main body of the apparatus, a ring shaped packing is wound on the outer circumference of a cylindrical tube adjacent to the end to be pressed between a pair of ring bodies which are formed with tapered edges of opposite inner sides, an inner tube having an equal diameter to that of the tube is connected with the end of the cylindrical tube through a cushioning material, on the outer circumference of the inner tube an outer tube is constructed integrally with one of the ring bodies, opening ends of both the inner and the outer tubes are adapted to be closed with a lid, and to the outer tube there are provided an exhausting tube for exhausting gas in the cylindrical tube and a gas introducing tube which interrupts an open air from the cylindrical tube with the flow of inert gas which flows when the lid is opened, and exhausting holes which connect with the exhausting tube and a plurality lines of gas holes for forming "gas curtain" are provided to the inner tube.

5 Claims, 1 Drawing Sheet

HEAT PROCESSING APPARATUS FOR SEMICONDUCTOR MANUFACTURING

BACKGROUND OF THE INVENTION

This invention relates to an improvement on a heat processing apparatus used in semiconductor manufacturing, especially those, such as oxidation furnaces, diffusion furnaces, and chemical vapor deposition (CVD) apparatuses, that performs out the required heat processing by accommodating and heating a number of semiconductor substrates (hereafter referred as wafers) while supplying the designated gas.

Prior Art

As a heat processing apparatus used in manufacturing semiconductors, for example, one such apparatus is disclosed in U.S. Pat. No. 4,484,538. In the above type of apparatus, fundamentally, wafers being treated are accommodated in a cylindrical tube fashioned from any suitble high-temperature resistant material such as quartz which has a heating means at the outer circumference thereof, and is adapted to supply treating gas into the tube.

Such conventional apparatus, however, has a disadvantage that in disassembly for adjusting the apparatus or assembling thereof, it is possible only in one direction to install or remove the cylindrical tube onto or from the heating means. That is, since at that end of the cylindrical tube which has a larger diameter and through which the wafers are accommodated and taken out, there is provided a flange which is expanded outwardly, installation and/or removal of the tube to the heating means are limited only from the end of a larger diameter at which the flange is provided. However, at this end there are mounted a wafer transporting device for loading wafers being treated into the tube, a lid device for opening/closing the cylindrical tube 9 or an exhausting means etc. Of course, it is not impossible to dispose these means in the apparatus so that they may not give any hindrance for the cylindrical tube being equipped with or removed therefrom, however, free designing is liable to be extremely hindered, and further there is often caused inconvenience in practical operation thereby.

To overcome the above-described disadvantages of the conventional apparatus it may be conceived to adapt the tube so that it may be installed and removed also in the other direction at its opposite end so tapered in a smaller diameter as to be connected to the exhausting means that, by making the inner diameter of the heating means larger than the outer diameter of the flange, however, between the heating means and the surface of outer wall of the tube there is generated a considerably wide space, so that heating efficiency is lowered, and for that reason it is necessary to use such a heating means as having calorific value larger than the heating means in the foregoing case. Accordingly, there are further problems both in economy and saving energy. In addition, in the conventional apparatus, since an airtight sealing is made by pressing the package to the flange, if planeness of a face of the flange at the end of a larger diameter is not exact, sealing can not be complete, and meanwhile accuracy of installation or fitting of the tube is not effected when an angle between the other face of the flange facing the end of a smaller diameter and the axial line of the tube is exact right angle in view of the fact that the apparatus is installed relating to the face of the flange, so that high accuracy is required for manufacturing the tube, which results in high cost of the apparatus.

SUMMARY OF THE INVENTION

With the view to solving the aforementioned problems, it is a main object of the present invention to provide an improved heat processing apparatus for manufacturing semiconductors in which treating gas is supplied to the surfaces of wafers which are disposed in the cylindrical tube and to be treated as desired.

To accomplish the above object, there is provided, according to the invention, a heat processing apparatus for manufacturing semiconductors comprising: a cylindrical tube having one end thereof tapered in smaller diameter and the other end thereof opened, said opened end having an equal diameter to that of a main body of said cylindrical tube; a ring shaped packing wound on the outer circumference of said cylindrical tube adjacent to said opened end; an inner tube connected with said opened of said tube; an outer tube fitted with the outer circumferences of said tube and said inner tube, and formed with a tapered part around an inside edge of the end facing said furnace cores tube; a ring body disposed on the outer circumference of said cylindrical tube opposite to said outer tube, and formed with a tapered part at an inside edge of facing said outer tube; a fastening means for fastening said outer tube and said ring body so that ring shaped packing held between said tapered parts of said outer tube and said ring body may be pressedly fixed to the outer circumference of said cylindrical tube; and a lid means for closing airtightly said opened ends of said outer tube and said inner tube.

In a preferred embodiment, said ring shaped packing is cooled with circulating cooling water.

In another preferred embodiment, a hollow flange portion is formed at the end of said outer tube as its side of said tube and cooling water is circulated in said hollow flange.

Preferably, said ring shaped packing is formed to be a hollow tube in which cooling water is circulated.

More preferably, one or a plurality lines of spouting holes are provided on said inner tube in a manner to align in the circumferential direction thereof, and one or a plurality of ventilation grooves are provided on the opposite inside surface of outer tube at positions corresponding to said spouting holes respectively, and a supplying piping means for suppling inert gas to said ventilation grooves is provided to said outer tube.

Hence, according to the invention, there is provided no flange on the tube, and the tube can be installed and detached in the directions of either end thereof, so that considerably free maintenance operation can be carried out.

Furthermore, manufacturing operation of the cylindrical tube becomes too easier in comparison with that of the conventional one that is provided with the flange, and high accurate working is unnecessary, so that cost for manufacturing the apparatus can be reduced.

Moreover, as the ring shaped packing is adapted to be wound around outer circumference of the tube, airtightness of the apparatus can be achieved easier as compared with that of the conventional one in which the surface of the flange must be contacted with the packing, accordingly, considerably free positioning of the tube is also enable and facility in assembling the apparatus can also be effected.

Further, the water cooling means for preventing the packing being wound around the tube is provided, and the heating means is disposed adjacently to the packing, so that the whole length of the tube can be shortened, which results in saving the amount of quartz material and reducing the cost required.

Other and further objects, features and advantages of the present invention will appear more fully from the following detailed description taken in connection with the accompanying drawings in which.

DETAILED DESCRIPTION OF PREFERRED EMBODIMENTS

Figure 1:
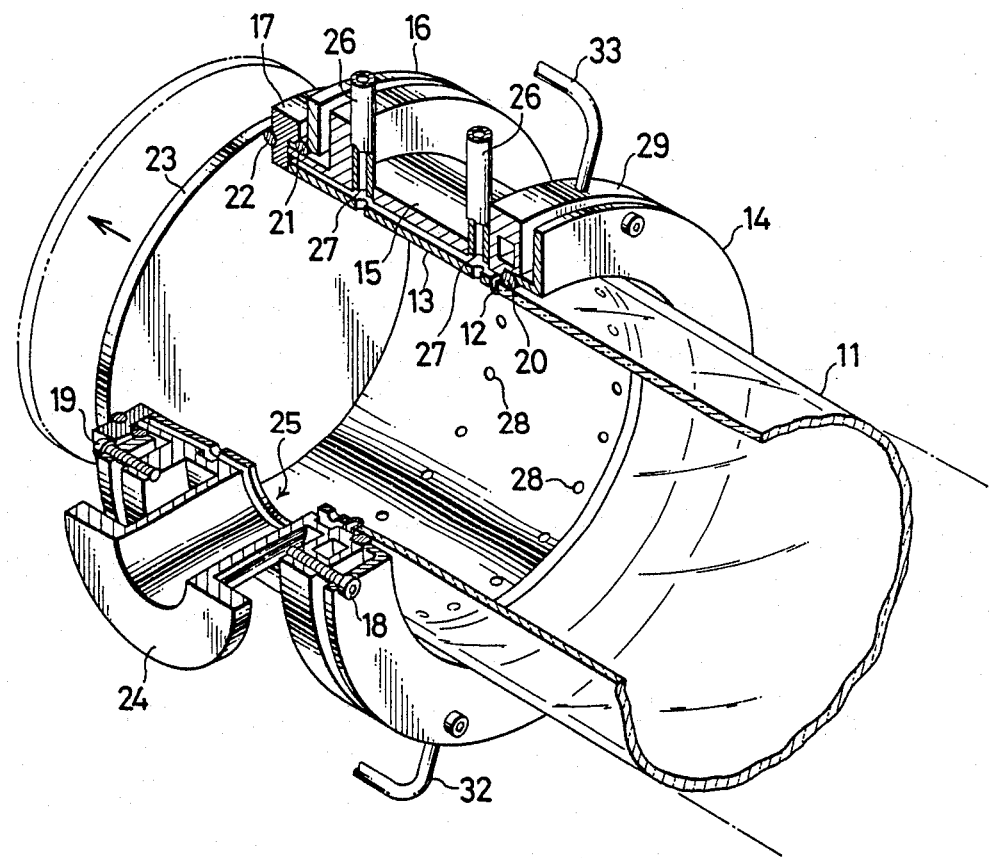
FIG. 1 is a partially exploded perspective view of a heat processing apparatus used in semiconductor manufacturing.
Figure 2:
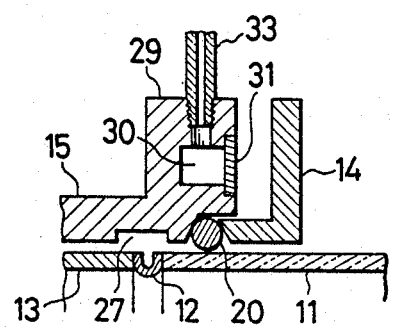
FIG. 2 is a sectional view showing essential parts of the apparatus in detail.

FIG. 1 is a partially exploded perspective view of a heat processing apparatus used in semiconductor manufacturing. FIG. 2 is a sectional view showing essential parts of the apparatus in detail. A cylindrical tube 11 is made of quarts, and at the tip end of the right part (not shown) i.e., at the end of a smaller diameter, which is tapered, according to the wall known CVD apparatus, there is constituted a treating gas introducing part, and a heating means is equipped at any suitable position on the outer periphery thereof (not shown).

The end of a larger diameter of the tube 11 is not given a shape of a flange as in the conventional apparatus, but merely given a form which is cut and separated from the body with the same diameter as that of the body. To the edge surface of the larger diameter end an inner tube 13 is contactingly connected, as shown in FIG. 2, through a cushion ring 12 having U shaped cross section. Of course, instead of the cushion ring 12 having U shaped cross section a metal C type ring of wire netting made of stainless steel, stainless alloy etc. may be used. Over the outer circumferences from the end of the tube 11 to the terminal end of the inner tube 13 there are mounted a first ring body 14, an outer tube 15 formed with two flanges at different positions thereof, a second ring body 16 and a flange 17. The ring body 14 and the outer tube 15 are connected by a bolt 18, and with a bolt 19 the outer tube 15 and the ring body 16 are connected. The flange 17 is also connected to the ring body 16 with a bolt not shown in figure.

The inside edges of opposite faces of the ring body 14 and the outer tube 15 are formed to be tapered as shown in FIG. 2, between which is held a ring shaped packing 20 wound on the outer surface of the tube 11, and further by adjusting an interval between the ring body 14 and the outer tube 15 with the bolt 18, intensity of pressing power of the packing 20 to the tube 11 can be set appropriately. In addition, like tapered portions are also formed at the inside edges of opposite faces of the second ring body 16 and the flange 17 so that they may hold therebetween a ring shaped packing 21 which is wound on the outer circumference of the end terminal portion of the outer tube 15, and with a bolt (not shown) intensity of pressing force can be controlled. On the end surface of the flange 17 there is bored a circular groove into which a ring shaped packing 22 is fitted. Thus, when a lid 23 is closed, airtight condition in the tube can be maintained. An exhausting tube 24 which is connected to an exhausting means such as a vacuum pump etc. is provided to the outer tube 15, and an exhausting hole 25 is formed at a position of the inner tube 13 corresponding to the tube 15.

Meanwhile, two gas introduction tubes 26 are mounted on suitable positions of the outer tube 15, and are formed ventilation grooves 27 at corresponding positions in the inside surface and in the circumferential direction thereof, and at those positions on the circumference of the inner tube 13 which align with these ventilation grooves 27, a plurality of spouting holes 28 are provided at suitable intervals. After wafers being treated are accommodated in the apparatus by opening the lid 23, these spouting holes 28 pressingly introduce inert gas (for example, $N_2$ gas) from the gas introduction tube 26, and spout the inert gas toward the central from each of the spouting holes 28 of the inner tube 13 to replace air existing between each of the wafers accommodated in the apparatus with the inert gas, and make so called "gas curtain" for interrupting the flow of open air into the tube 11. Further, on a flange 29 of the outer tube 15 at the side of the tube 11 a groove 30 is provided along the circumference of the tube 15 which is stopped with a lid plate 31 to constitute a conduit in a tunnel shape, and a water supplying pipe 32 for cooling water and a draining pipe 33 are also provided thereon. The reason why these means are provided is that since the tube 11 is heated to high temperature in heat CVD treatment, both of the pipe means serve as water cooling means to improve durability of the packing, although as the packing 20 heat resisting material such as silicone rubber etc. is used.

The apparatus shown in FIGS. 1 and 2 is constructed as afore-described, so that when the lid plate 23 is closed as shown with a solid line, in the inside of the apparatus is, excluding the exhausting holes 28 and the treating gas introduction part of the tube 11, held in airtightly by the three packings 20, 21 and 22, by which an atmosphere suitable for the CVD treatment is generated by interrupting from the open air.

In performing maintenance operation such as completing, repairing service etc., the bolt 18 is removed to release the connection between the ring 14 and the outer tube 15, then the tube 11 can be extracted to the side at which the heating means is mounted, or can be equipped insertingly thereinto. The arrangements provided at the tip end of the tube 11 are, in general, relatively small scaled ones such as the treating gas introduction and supply piping means, so that equipping and detaching operations are extremely easy to carry out. Of course, it is also possible to equip and/or remove the tube 11 to and from the end having larger diameter. Thus, equipping and/or removing (detaching) operation can be carried out to and/or from both the ends, so that maintenance operation can be extremely rationalized in comparison with that of the conventional apparatus in which the equipping and/or removing operation can only be performed to and/or from the end of a larger diameter. In addition, in the conventional apparatus in which the ring shaped packing is adapted to contact with the surface of the flange, holding airtightness is difficult if the planeness of the surface of the flange is not accurate, as described the above. Further, when the surface of the flange is out of accurate right angle with respect to the axial line of the cylindrical tube, there are disadvantages such as a displacement of installation position of the tube etc. in the conventional apparatus. On the contrary the apparatus according to the present invention is adapted such that the ring shaped packing 20 wound on the outer circumference of the tube 11 is held pressingly between the ring body 14 and the outer tube 15 the opposite inside edges of which are respectively tapered, so that even if there are any slight deformed portions, unevenness etc. on the circumferential surface of the tube, sure airtightness of the apparatus can be expected, and considerably free adjustment of inclination in installing the tube can be permitted, so that assembling operation of the present apparatus becomes quite easier. For the purpose of protecting the ring shaped packing 20 which winds on the outer circumference of the tube 11 from being overheated, the conduit (for water) 30 is provided on the flange part 29 on the outer tube 15 so that cooling water may be circulated therein, thereby enabling a distance between the ring shaped packing 20 and the heating means to be relatively narrow, which results in shortening of the length of the tube 11.

Figure 3:
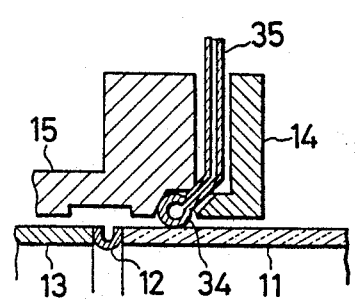
FIG. 3 is a sectional view showing the same essential parts as in FIG. 2 according to another embodiment of the invention.

In the embodiment above mentioned, the conduit for water for cooling the packing is provided at the flange portion 29 of the outer tube 15, however, as shown in FIG. 3, it is also possible to connect the water supplying pipe and a draining pipe 35 (either one of them is shown) with the ring shaped packing 34 to circulate cooling water by making a ring shaped packing 34 itself to be a hollow tube.

In addition, in the first embodiment shown in FIG. 1, there is provided respective two sets of gas introducing tubes 26, the ventilation grooves 27 and lines of spouting holes 28 for the purpose of forming "gas curtain" of inert gas, however, they are not limited to two sets of them, but one set of them, three sets of them or more than three sets of them may be also provided.

The above-described concerns one of the embodiments in which the present invention is applied to a reduction pressure CVD apparatus. However, the present invention is not limited only thereto, but can be applied to those CVD apparatus such as permanent pressure CVD, heating CVD etc., and the present invention can be further applied to the diffusion furnace, oxidizing furnace, reduction pressure oxidizing furnace etc. Thus, the application of the present invention is never limited by manners of treatment.

The present invention provides the following effects and functions.

While the preferred embodiments of the present invention have been described above, it should be understood that various modification may be made herein without departing the spirit of the invention and the scope of the appended claims.

What is claimed is:

1. A heat processing apparatus for manufacturing semiconductors comprising:
    a cylindrical tube having one end thereof tapered to a smaller diameter than that of a main body of said cylindrical tube and the other end thereof open, said open end having an equal diameter to that of said main body of said cylindrical tube;
    a ring shaped packing wound on the outer circumference of said cylindrical tube adjacent to said open end;
    an inner tube coaxial with and longitudinally adjacent said open end of said cylindrical tube;
    an outer tube fitted over the outer circumferences of said cylindrical tube and said inner tube;
    a ring body disposed on the outer circumference of said cylindrical tube adjacent and opposing said outer tube, said outer tube and ring body having respective tapered edges facing said cylindrical tube and cooperating to define a channel in which said ring shaped packing is located, said tapered edges forcing said ring shaped packing against the outer circumference of said cylindrical tube with a force determined by the axial spacing between said ring body and said outer tube;
    a fastening means for adjusting the axial distance between said ring body and said outer tube and thereby adjusting the pressure with which said ring shaped packing presses radially on said outer circumference of said cylindrical tube; and
    lid means for closing an open end of said outer tube in an airtight manner and said inner tube.

2. A heat processing apparatus for manufacturing semiconductors according to claim 1, wherein said ring shaped packing is cooled with circulating cooling water.

3. A heat processing apparatus for manufacturing semiconductors according to claim 2, wherein a hollow flange portion is formed at the end of said outer tube in the area of said ring shaped packing.

4. A heat processing apparatus for manufacturing semiconductors according to claim 2, wherein said ring shaped packing is a hollow tube in which cooling water is circulated.

5. A heat processing apparatus for manufacturing semiconductors according to claim 1, wherein:
    at least one circumferentially extending line of spout holes is provided on said inner tube in and at least one ventilation groove is provided on the inside surface of said outer tube at positions corresponding to said spout holes and a supply piping means for supplying inert gas to said ventilation groove is provided on said outer tube.

* * * * *